(12) United States Patent
Moradpour et al.

(10) Patent No.: US 9,331,274 B2
(45) Date of Patent: May 3, 2016

(54) MEMRISTIVE ELEMENT AND ELECTRONIC MEMORY BASED ON SUCH ELEMENTS

(75) Inventors: Alexandre Moradpour, Paris (FR); Olivier Schneegans, Antony (FR); Alexandre Revcolevschi, Boulogne (FR); Sylvain Franger, Gif-sur-Yvette (FR); Raphaël Salot, Lans-en-Vercors (FR)

(73) Assignees: Centre National de la Recherche Scientifique, Paris (FR); Commissariat a L'Energie Atomique et aux Energies Alternatives, Paris (FR); Universite Paris—SUD 11, Orsay (FR)

( * ) Notice: Subject to any disclaimer, the term of this patent is extended or adjusted under 35 U.S.C. 154(b) by 176 days.

(21) Appl. No.: 13/994,936

(22) PCT Filed: Dec. 14, 2011

(86) PCT No.: PCT/IB2011/055672
§ 371 (c)(1),
(2), (4) Date: Jul. 12, 2013

(87) PCT Pub. No.: WO2012/080967
PCT Pub. Date: Jun. 21, 2012

(65) Prior Publication Data
US 2013/0277638 A1 Oct. 24, 2013

(30) Foreign Application Priority Data
Dec. 17, 2010 (FR) ...................................... 10 04931

(51) Int. Cl.
*H01L 45/00* (2006.01)
(52) U.S. Cl.
CPC ............ *H01L 45/1253* (2013.01); *H01L 45/04* (2013.01); *H01L 45/145* (2013.01)

(58) Field of Classification Search
CPC ... H01L 45/08; H01L 45/1233; H01L 45/147; H01L 45/145; H01L 45/146; G11C 13/0007; G11C 13/0009; G11C 2213/56; G11C 2213/77
See application file for complete search history.

(56) References Cited

U.S. PATENT DOCUMENTS

| 7,417,271 B2 | 8/2008 | Genrikh et al. |
| 7,763,880 B2 | 7/2010 | Williams |

(Continued)

FOREIGN PATENT DOCUMENTS

| WO | WO 2008/145864 A2 | 12/2008 |
| WO | WO 2010/014064 A1 | 2/2010 |
| WO | WO 2010/074589 A2 | 7/2010 |

OTHER PUBLICATIONS

International Search Report and Written Opinion for Application No. PCT/IB2011/055672 dated Mar. 8, 2012.

(Continued)

*Primary Examiner* — Whitney T Moore
*Assistant Examiner* — Joseph Galvin, III
(74) *Attorney, Agent, or Firm* — Alston & Bird LLP

(57) ABSTRACT

The invention relates to a memristive element (M) formed by: a first electrode (10); a second electrode (30); and an active region (20) making direct electrical contact with said first and second electrodes, characterized in that said active region essentially consists of a thin film of an insertion compound containing at least one alkali metal, said compound being an oxide or chalcogenide of at least one transition metal and being able to conduct both electrons and ions. Non-volatile electronic memory formed from a plurality of such memristive elements.

15 Claims, 2 Drawing Sheets

(56) References Cited

U.S. PATENT DOCUMENTS

| | | | |
|---|---|---|---|
| 2008/0079029 A1 | 4/2008 | Williams | |
| 2008/0180989 A1* | 7/2008 | Baek | G11C 11/5607 365/158 |
| 2010/0102289 A1* | 4/2010 | Dimitrov | G11C 13/0007 257/2 |
| 2010/0195475 A1 | 8/2010 | Moradpour et al. | |
| 2011/0065000 A1* | 3/2011 | Chang | H01M 4/131 429/212 |
| 2011/0186798 A1* | 8/2011 | Kwon | H01L 45/00 257/2 |

OTHER PUBLICATIONS

Chua, L., *Memristor—The Missing Circuit Element*, IEEE Transactions on Circuit Theory, vol. 18, No. 5, (Jan. 1971) 507-519.

Abgall, F., *Switching Phenomena in Titanium Oxide Thin Film*, Solid-State Electronics, vol. 11 (1968) 535-541.

Borghetti, J. et al., *"Memristive" Switches Enable "Stateful" Logic Operations Via Material Implication*, Nature, vol. 464 (Apr. 2010) 873-876.

Schneefans, O. et al., J. Amer. Chem. Soc. 129 (2007) 7482.

Schneefans, O., et al., J. Phys. Chem. B 108 (2004) 9882.

Strukov, D.B. et al., *The Missing Memristor Found*, Nature, vol. 452 (May 2008) 80-83.

Waser, R., *Nanoionics-Based Resistive Switching Memories*, Nature Materials, vol. 6, (Nov. 2007) 833-840.

Yang, J. J. et al., Nanotechnol. 20 (2009) 215201.

*Redox-Based Resistive Switching Memories—Nanoionic Mechanisms, Prospects and Challenges*, Advanced Materials 21 (2009) 2632-2663.

* cited by examiner

MEMRISTIVE ELEMENT AND ELECTRONIC MEMORY BASED ON SUCH ELEMENTS

FIELD

The invention relates to a memristive element, and to a nonvolatile electronic memory based on the use of a plurality of such elements.

BACKGROUND

The "memristor" concept was introduced in 1971 by L. O. Chua in the article "*Memristor—The Missing Circuit Element*", IEEE Transactions on Circuit Theory, Vol. CT-18, 1971, pages 507-519.

Theoretically, a memristor is defined as an element (more exactly, an electrical dipole) in which the magnetic flux $\Phi_B$ depends on the electric charge q that has passed through the element. The "memristance" M(q) is defined by:

$$M(q) = \frac{d\Phi_B}{dq}$$

It is possible to demonstrate that it follows from this definition that:

$$V(t)=M(q(t))I(t)$$

where V(t) is the voltage across the terminals of the dipole and I(t) the current flowing through it, both expressed as a function of time t. In other words, at any moment M(q) is equivalent to a resistance the value of which varies as a function of q, and therefore of the "history" of the current I (the trivial case where M(q)=R, i.e. a constant, and the memristor could be replaced by an ordinary resistor is not considered here).

If the V-I characteristics of a memristor are plotted, in general a curve exhibiting a double hysteresis cycle is obtained, as illustrated in FIG. 1.

Because of this characteristic, certain memristors exhibit a bistable behavior and can be used as nonvolatile memory elements. Applying a voltage across the terminals of such a device causes a large variation in its resistance; for example, it passes from a high value, representing a logic value of "1", to a low value, representing a value of "0". As the V-I characteristics exhibit hysteresis, this resistance value is maintained when the voltage drops to zero; it is necessary to apply an inverse voltage in order to return to the initial (high) resistance value.

This bistable behavior also allows matrices of memristors to be used to carry out logic operations. See in this regard the article by J. Borghetti et al. "'*Memristive' switches enable 'stateful' logic operations via material implication*", Nature, Vol. 464, pages 873-876, 8 Apr. 2010.

Even before the "memristor" concept had been formulated, certain materials, and especially thin films of $TiO_2$, were already known by the electrochemists community, from the 1960s, to exhibit a behavior that could be qualified as "memristive": see the article by F. Abgall "*Switching phenomena in titanium oxide thin films*", Solid-State Electronics 1968. Vol. 11, pages 535-541.

Production of an electronic element that could be qualified as a "memristor" was described for the first time in the article by D. B. Strukov et al. "*The missing memristor found*", Nature, Vol. 453, pages 80-83, 1st May 2008. This element used a $TiO_2/TiO_{2-x}$ bilayer as an active material. See also documents US 2008/0079029, U.S. Pat. No. 7,763,880 and U.S. Pat. No. 7,417,271, which also envisage a possible generalization to other oxides, optionally of relatively complex composition.

The resistivity change that is the basis of the memristive behavior of these prior-art elements is caused by the migration, induced by an electric field, of dopant species—and in particular of oxygen vacancies—from a first conductive film that is rich therein to a second film that is deprived thereof, and that is therefore less conductive. The drawback of these devices is the relative complexity of the manufacture of the bilayer (even, in certain cases, the multilayer) structure.

As for the device described in the aforementioned article by J. Borghetti et al., it comprises just one $TiO_2$ film sandwiched between two metallic films. It is known, in such a structure, that the dopant species (oxygen vacancies) form conductive filaments between the two metallic electrodes; see in this regard the articles by R. Waser "*Nanoionics-based resistive switching memories*", Nature materials, Vol. 6, pages 833-840, November 2007, and "*Redox-Based Resistive Switching Memories—Nanoionic Mechanisms, Prospects and Challenges*", Advanced Materials 21, pages 2632-2663, 2009. The growth of these conductive filaments is a random process that takes place along lattice dislocations. It is therefore difficult to ensure the presence of at least one of these filaments in a nanoscale device, thereby preventing its reliable operation. Therefore, a resistance-switching mechanism based on the formation of filamentary conductive pathways is intrinsically of a nature to limit device miniaturization.

It should also be underlined that the initial formation of these conductive filaments requires a preliminary film "electroforming" step, which is still little understood and therefore difficult to control (J. J. Yang et al., *Nanotechnol.*, 2009, 20, 215201).

Document WO 2010/074689 reports memristive devices comprising a single active region, produced from a material comprising at least two mobile species. Several families of materials of this type are mentioned, among which substitution compounds in which alkali-metal atoms replace transition-metal atoms in order to form interstitial defects that act as dopants. It would seem that an electroforming step is also necessary to ensure that these devices operate (see the aforementioned article by J. Yang et al.).

Document US 2010/102289 describes a resistive memory element the active region of which comprises two films that are metallic or made of metal oxide, one of which is doped with a charge carrying species, these two films being separated by an intermediate film produced from a material other than that or those of the two other films. Production of such a device is complex.

Document WO 2008/145864 describes the use of insertion compounds of at least one alkali metal, made of an oxide or chalcogenide of at least one transition metal, exhibiting conductivity that is both electronic and ionic in nature and, most often, having a lamellar structure, to produce mass memories. Certain of these materials, such as $Na_xCoO_2$ and $Li_xCoO_2$ ($0<x\leq1$), are known as materials used to produce electrochemical batteries. See document EP 1 860 713, for example.

The mass memories described in the aforementioned document WO 2008/145864 comprise a bulk single-crystal substrate made of such a material, above which an atomic force microscope (AFM) probe is placed. A water meniscus forms spontaneously between the probe and the surface of the substrate; this meniscus ensures electrical conduction between these two elements and forms an electrochemical cell in which redox reactions can take place. It is precisely electrochemical reactions of this type, induced by applying a potential difference between the AFM probe and the substrate, that form the basis of operation of the mass memory.

Specifically, a change in the oxidation number of a transition-metal atom is accompanied by an inserted (or "intercalated", the two terms being equivalent) alkali-metal atom being ejected to the surface, or, conversely, being returned to the core of the substrate, producing a reversible change in surface conductivity. See in this regard the following articles:

O. Schneegans, A. Moradpour, O. Dragos, S. Franger, N. Dragoe, L. Pinsard-Gaudart, P. Chretien, A. Revcolevschi, J. Amer. Chem. Soc, 2007, 129, 7482; and O. Schneegans, A. Moradpour, L. Boyer, D. Ballutaud, J. Phys. Chem. B, 2004, 108, 9882.

Such memories are very difficult and expensive to implement: the single-crystal substrates are difficult to manufacture and some of them, such as $Na_xCoO_2$, are unstable in air; the use of AFM probes introduces considerable complexity and requires a movable read head to scan the surface of the substrate.

SUMMARY

The invention aims to overcome the aforementioned drawbacks of the prior art.

The present inventors have demonstrated that thin—even not single-crystal—films of these insertion compounds of at least one alkali metal, made of an oxide or chalcogenide of at least one transition metal, when placed in direct electrical contact with two electrodes, have a very marked memristive behavior. This allows "crossbar" matrices of resistive elements having a very simple structure and no moving parts to be produced. Moreover, thin polycrystalline or amorphous films are much simpler and less expensive to produce than single-crystal substrates. Miniaturization may be pushed to advanced levels (nanoscale memory cells), the memory then having a very short (nanosecond) write time. Specifically, movements of alkali-metal ions, and in particular $Li^+$ or $Na^+$ ions, which are small and therefore much more mobile than the oxygen vacancies responsible for the memristive behavior of $TiO_2$ films, are used to cause the changes in electrical conductivity. The change in conductivity of these materials is not caused by the formation of filaments, and no preliminary electroforming is necessary.

It is important to note that the operating principle of these devices—not completely understood at the present time—is fundamentally different from that of the mass memory of the aforementioned document WO 2008/145864 because of the different nature of the active material (thin film instead of a bulk single-crystal substrate) and the absence of water meniscus.

One subject of the invention is therefore a memristive element formed by: a first electrode, a second electrode, and an active region making direct electrical contact with said first and second electrodes, characterized in that said active region consists essentially or exclusively of a thin film of an insertion compound of at least one alkali metal, made of an oxide or chalcogenide of at least one transition metal, exhibiting conductivity that is both electronic and ionic in nature.

According to various embodiments of the invention:
Said thin film may be deposited on a surface of said first electrode.
Said first electrode may be chosen from a surface of a degenerate semiconductor substrate and a metallic film deposited on an insulating substrate.
Said second electrode may be formed by a metallic film deposited on said thin film.

Said thin film may have a polycrystalline or amorphous structure. The expression "polycrystalline" must be understood to have a broad meaning, covering microcrystalline and nanocrystalline films or films formed from crystallites bound together by an amorphous matrix.

Said thin film may be 10 μm or less in thickness, and preferably between 5 nm and 1 μm in thickness.

Said insertion compound of at least one alkali metal, made of an oxide or chalcogenide of at least one transition metal, may have the following formula:

$$A_x(M_1)_v(M_2)_w(M_3)_y(M_4)_z B_\beta$$

where:
A represents one or more alkali metals;
$M_1$ represents at least one metal chosen from Ag and Cu;
$M_2$ represents at least one metal chosen from Mg, Ca, Sr, Ba, Ti, Mn, Fe, Cu and Zn;
$M_3$ represents at least one metal chosen from Al, Ti, V, Cr, Mn, Fe, Co, Ni, Mo and Ta;
$M_4$ represents at least one metal chosen from Ti, V, Mn, Co, Ni, Zr, Sn and Ta;
B represents at least one nonmetal chosen from O, S, Se and Te;
the parameters x, v, w, y, z and β satisfy the following inequalities, x in addition being chosen in the stability field of the compounds:
$0 < x \leq 1$
$0 \leq v \leq 1$
$0 \leq w < 1$
$0 \leq y \leq 1$
$0 \leq z < 1$
$1.5 \leq \beta$; and
the parameters x, v, w, y and z also satisfy the equality: $v+w+y+z=1$.

Furthermore, preferably $\beta \leq 10$ and more preferably $\beta \leq 5$.

More precisely, said insertion compound of at least one alkali metal, made of an oxide or chalcogenide of at least one transition metal, may have the following formula:

$$A'_x M_y B_\beta$$

where:
A' represents at least one alkali metal chosen from Li and Na;
M represents at least one metal chosen from Mn, Fe, Co and Ni;
B represents at least one nonmetal chosen from O and S; and
the parameters x, y and β satisfy the following inequalities, x in addition being chosen in the stability field of the compounds:
$0 < x \leq 1$
$y = 1$
$1.5 \leq \beta$.

Furthermore, as indicated above, preferably $\beta \leq 10$ and more preferably $\beta \leq 5$.

Even more precisely, said insertion compound of at least one alkali metal, made of an oxide or chalcogenide of at least one transition metal, may be chosen from the following: $Na_xCoO_2$, $Li_xCoO_2$, $Li_xNiO_2$, $Li_xMn_4O_9$, $Li_xTiO_2$, $Li_{4+x}Ti_5O_{12}$, $Li_xV_2O_5$, $Li_xV_6O_{13}$, $Li_xNi_yCo_{(1-y)}O_2$, $Li_xFeO_2$, $Li_xMnO_2$, $Li_xMn_2O_4$, $Li_xMoO_3$ and $Li_xNi_{1/3}Mn_{1/3}CO_{1/3}O_2$, the parameter x being chosen in the stability field of these compounds. It will be noted that certain of these formulae have been written in a form in which the parameter y may have a value higher than 1. Of course, they may always be normalized to return to the case y=1.

Preferably, said insertion compound of at least one alkali metal, made of an oxide or chalcogenide of at least one transition metal, may be chosen from $Na_xCoO_2$ and $Li_xCoO_2$.

Said insertion compound of at least one alkali metal, made of an oxide or chalcogenide of at least one transition metal, may have a lamellar structure.

At least one of said first and said second electrodes may be made of silicon. In a preferred embodiment of the invention, one (and only one) of said first and said second electrodes is made of silicon, and said insertion compound of at least one alkali metal is $Li_xCoO_2$.

As a variant, at least one of said first and said second electrodes may be made of a material chosen from aluminum, gallium, indium, antimony, bismuth, cadmium, zinc, tin, and lead.

Another subject of the invention is a nonvolatile electronic memory formed from a plurality of memristive elements such as described above, arranged in a matrix in rows and columns, all the elements of a given row sharing a common first electrode, and all the elements of a given column sharing a common second electrode.

BRIEF DESCRIPTION OF THE DRAWINGS

Other features, details and advantages of the invention will become apparent on reading the description, given with reference to the appended drawings (provided by way of non-limiting example) in which.

DETAILED DESCRIPTION

Figure 2:
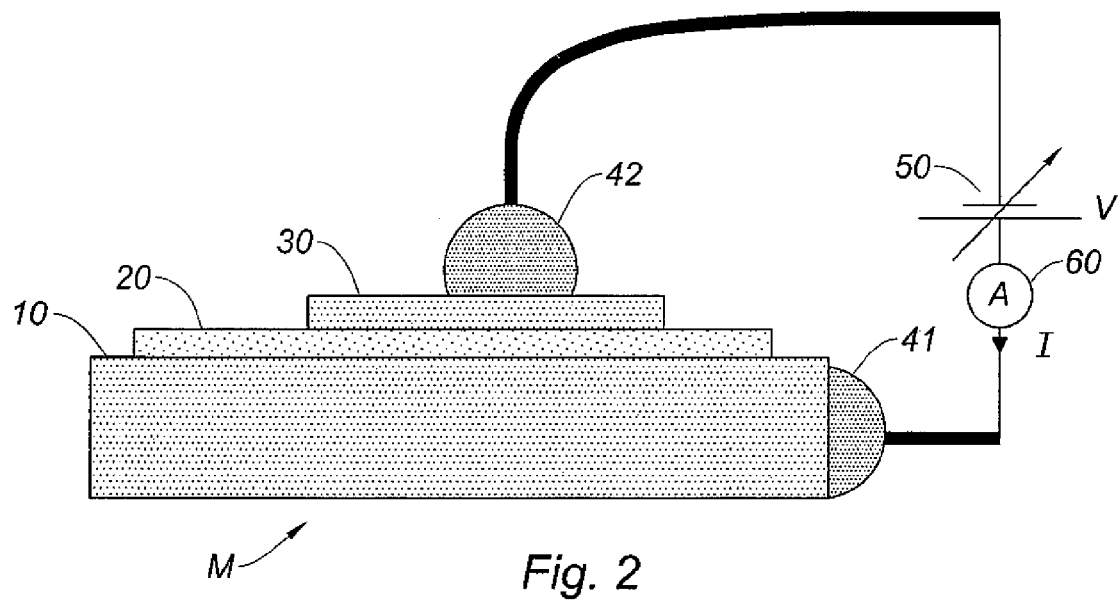
FIG. 2 shows a schematic of a memristive element according to one embodiment of the invention.

The device M in FIG. 2 is formed from a substrate 10 made of highly n-doped degenerate silicon (as a variant, p-type doping could be used), therefore behaving like a metal and serving as a first electrode, on which a 100 nm-thick active $Li_{0.9}CoO_2$ film 20 is deposited. A gold pad 30 that is 100 µm×400 µm in size is deposited on the film 20 in order to form the second electrode of the device. Two electrical contacts 41, 42 are made, one to the substrate 10 and one to the pad 30, in order to allow a variable potential difference V to be applied by means of the generator 50. An ammeter 60 measures the current I flowing through the device.

The generator 50 is used to apply a first voltage ramp from 0 V to +4 V (R1 in FIG. 3), then a second ramp from +4 V to −4 V (the first part, from +4 V to 0 V, is indicated by the reference R2; the second part, from 0 V to −4 V, is indicated by R3) and lastly a third ramp from −4 V to 0 V (R4). The forward directions of the voltage and current are shown in FIG. 2. The graph in FIG. 3 shows the absolute value of the current, on a logarithmic scale, as a function of voltage, on a linear scale.

Figure 3:
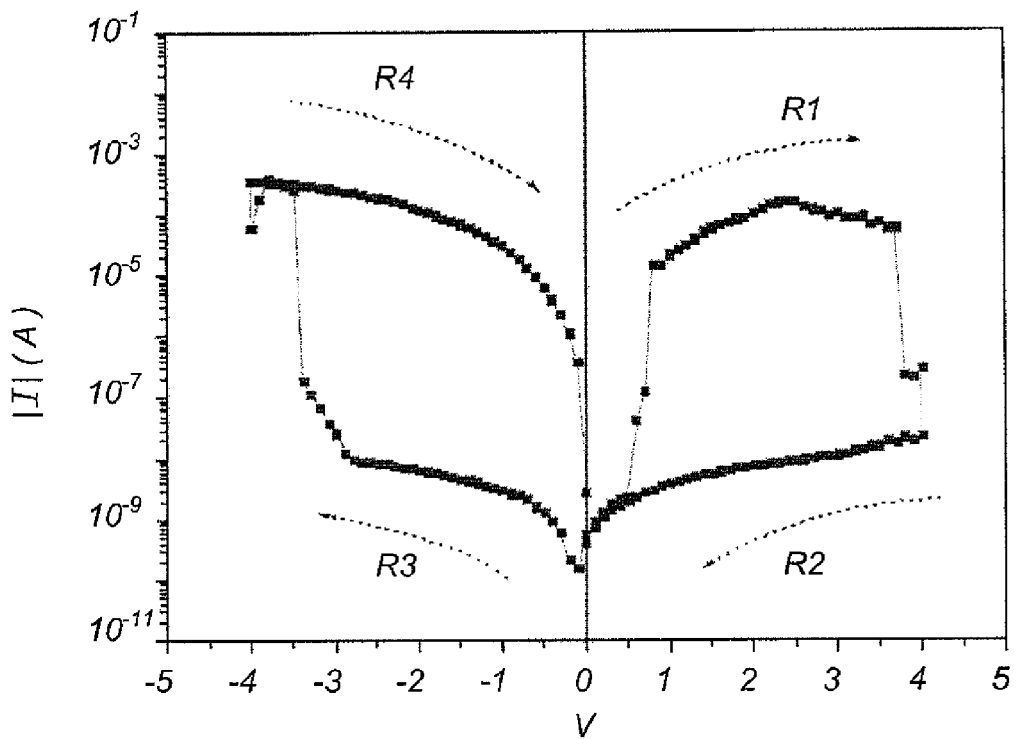
FIG. 3 shows, on a semi-logarithmic scale, the voltage-current characteristics of the device in FIG. 2.

It may be seen from FIG. 3 that initially, at the start of the ramp R1, the current rapidly increases with voltage, thereby indicating that the resistance of the device is relatively low (a few kΩ); then, above 1 V, the current stabilizes, thereby indicating a gradual increase in the resistance, up to about 25 kΩ. At about 3.8 V, the current drops abruptly by about three orders of magnitude, thereby indicating that the element M has made a transition from a first low-resistance state (the resistance value varies as a function of voltage, but is always about 25 kΩ or less) to a second high-resistance (about 10 MΩ) state.

When the voltage decreases (R2) and then becomes negative (R3), the resistance of the device changes little and remains at least about one MΩ. It is only when V reaches −3.5 V that another abrupt transition occurs, this time from the second state to the first.

The resistance of the element remains about a few kΩ/a few tens of kΩ when the voltage returns to zero (R4). The cycle may be repeated a number of times.

The device in FIG. 2 was produced with the aim of validating the principle of the invention; because of its large size, it has a switching time of about one second. A device intended for commercial applications could be much smaller in size, about 10 nm×10 nm, and have a switching time, which may be estimated by extrapolation, of about a few nanoseconds.

Many variants of the device of the invention may be envisioned.

For example, the first and second electrodes may both be made of a metal, or indeed of a degenerate semiconductor. They may especially be metal tracks, even tracks made of polysilicon, deposited on an insulating substrate ($SiO_2$, intrinsic Si, etc.).

Figure 1:
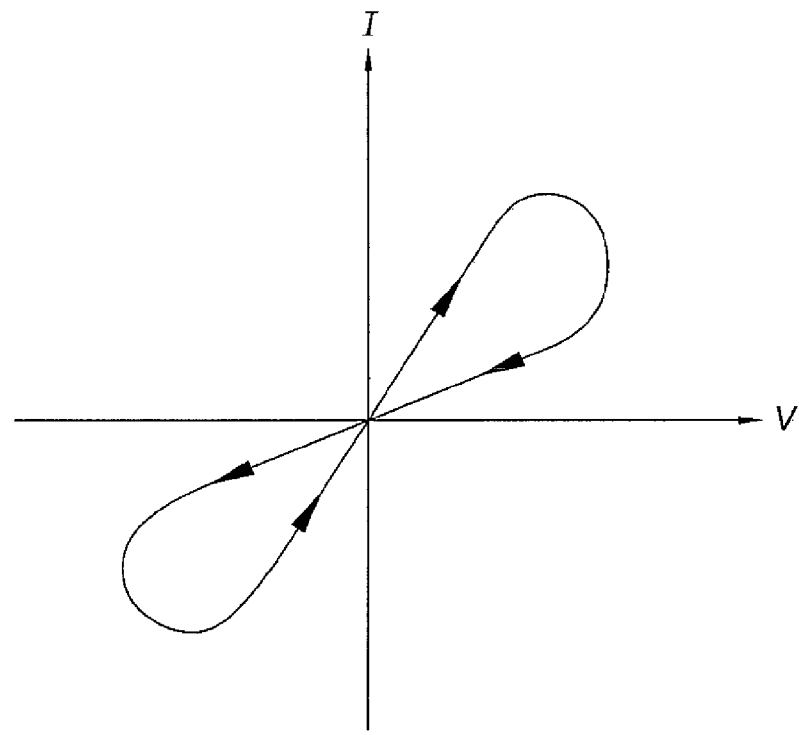
FIG. 1, described above, illustrates, in a general way, the voltage-current characteristics of a memristor.

It has been observed that the difference in electrical resistance between the two states of the memristive device is particularly large when one of the two electrodes (for example, the first electrode 10 of the device in FIG. 1) is produced from a material capable of forming an alloy with the (or at least one) alkali metal of the active film; this may be silicon, aluminum, gallium, indium, antimony, bismuth, cadmium, zinc, tin, or lead. It has been observed that, in this case, the alkali-metal ions penetrate rather deeply (500 nm in the case of the device in FIG. 2, where the first electrode is made of highly doped silicon and the alkali metal is lithium) into the electrode; although the mechanism is not completely understood, this seems to play an important role in the resistance switching.

The other electrode may be produced from a noble metal, such as gold, platinum, etc. Because of its chemical inertness, such a material does not take part in the electrochemical reactions that occur in the active volume. The use of two electrodes made of noble metals is possible, but less advantageous.

Such a configuration is particularly well suited to the production of matrices of memristors, as will be discussed below with reference to FIGS. 4A and 4B.

Other materials may be used to produce the active film 20, these materials belonging to the family of the insertion compounds of an (at least one) alkali metal, made of an oxide or chalcogenide of a (at least one) transition metal, exhibiting conductivity that is both electronic and ionic in nature and generally having a lamellar structure.

Materials suitable for implementing the invention are characterized by the general formula $$A_x(M_1)_v(M_2)_w(M_3)_y(M_4)_zB_\beta$$

where:

A represents one or more alkali metals;

$M_1$ represents at least one metal that can have an oxidation number equal to 1, and more particularly chosen from Ag and Cu;

$M_2$ represents at least one metal that can have an oxidation number equal to 2, and more particularly chosen from Mg, Ca, Sr, Ba, Ti, Mn, Fe, Cu and Zn;

$M_3$ represents at least one metal that can have an oxidation number equal to 3, and more particularly chosen from Al, Ti, V, Cr, Mn, Co, Ni, Mo and Ta;

$M_4$ represents at least one metal that can have an oxidation number equal to 4, and more particularly chosen from Ti, V, Mn, Fe, Co, Ni, Zr, Sn and Ta; and B represents at least one nonmetal, in particular chosen from O, S, Se and Te.

The parameters x, v, w, y, z and β must satisfy the following inequalities: $0<x\leq 1$; $0\leq v\leq 1$; $0\leq w<1$; $0\leq y\leq 1$; $0\leq z<1$; and $1.5\leq\beta$. Thus, the parameter x may vary between 0 (exclusive, because the presence of an alkali metal is essential) and 1 (inclusive), whereas the parameters v, w, y and z may vary, individually, between 0 (inclusive) and 1 (inclusive), their sum (v+w+y+z) being required to equal 1. Another constraint on the values of v, w, y and z is that at least one transition metal must be present. In addition, x must have a value that ensures the chemical stability of the compound (the stability ranges of the parameter x depend on the qualitative composition of the material). As regards the parameter β (beta), it is 1.5 or more; it is difficult to define an upper limit on the value of this parameter; in the vast majority of cases, however, this value will remain less than or equal to 10 or even less than or equal to 5.

Advantageously, the material may be characterized by the general formula $A'_x M_y B_\beta$, where:

A' represents at least one alkali metal chosen from Li and Na;

M represents at least one metal chosen from Mn, Fe, Co and Ni;

B represents at least one nonmetal chosen from O and S; and the parameters x, y and β satisfy the following inequalities, x in addition being chosen in the stability field of the compounds: $0<x\leq 1$; y=1 (this condition can always be met by normalizing the formula); and $1.5\leq\beta$.

In particular, mention may be made of the following materials (unnormalized formulae): $Na_xCoO_2$, $Li_xCoO_2$, $Li_xNiO_2$, $Li_xMn_4O_9$, $Li_xTiO_2$, $Li_{4+x}Ti_5O_{12}$, $Li_xV_2O_5$, $Li_xV_6O_{13}$, $Li_xNi_yCo_{(1-y)}O_2$, $Li_xFeO_2$, $Li_xMnO_2$, $Li_xMn_2O_4$, $Li_xMoO_3$ and $Li_xNi_{1/3}Mn_{1/3}CO_{1/3}O_2$.

The compounds $Na_xCoO_2$ and $Li_xCoO_2$ are particularly preferred.

The thickness of the active film is given merely by way of example. In general, a film is considered to be "thin" if it is less than or equal to 10 μm in thickness, and preferably less than or equal to 1 μm in thickness. The minimum acceptable thickness depends on the material used; by way of indication, this thickness will preferably be greater than or equal to 10 nm.

Figure 4A:
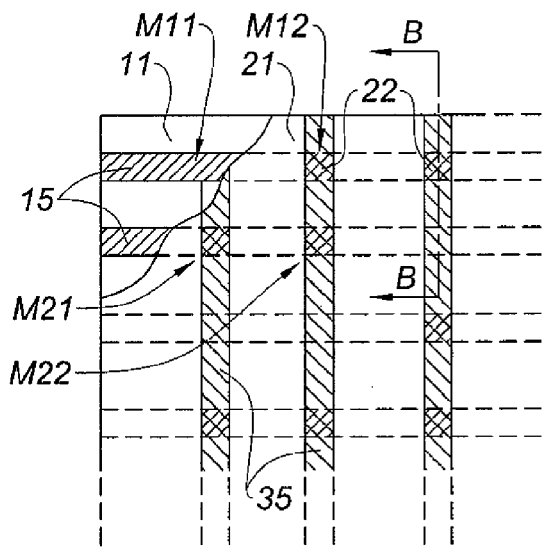
FIGS. 4A and 4B illustrate schematics of the structure of an electronic memory according to a second embodiment of the invention.
Figure 4B:
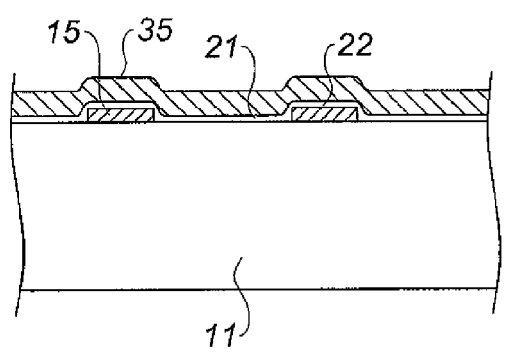

FIG. 4A shows a front view of a matrix of memristive elements M11, M12, M21, M22, etc. of nanoscale dimensions, and FIG. 4B a cross-sectional view, along the line B-B, of the same matrix.

Conductive tracks 15 (drawn with dotted lines) forming the "first electrodes" of the elements are deposited on an insulating substrate 11. All the elements of a given row of the matrix share the same first electrode (or, equivalently, they could have their first electrodes electrically connected together). A continuous film 21 of active material, preferably between 10 and 100 nm in thickness, is deposited on the substrate 11 and the first electrodes (in the figure, one corner of the film 21 has been omitted in order to show the elements located below). Other conductive tracks 35 are deposited perpendicular to the rows 15 on the substrate and on the active regions. The volumes of active film lying between a lower conductive track 15 and an upper conductive track 25 form the active regions 22 of the elements of the matrix. Localized deposition of the active material only where the electrodes overlap is also possible, and even preferable because it guarantees better (electrical and chemical) isolation between the elements of the matrix; however, this embodiment is more complicated to implement.

For the reasons given above, the conductive tracks and/or 35 will preferably be produced from a conductive material capable of forming an alloy with the (or at least one) alkali metal of the active film—silicon for example. The use of silicon is particularly preferable for technological reasons.

It may be seen that all the elements of a given row of the matrix share the same second electrode formed by a track 35 (or, equivalently, they could have their first electrodes electrically connected together). A "crossbar" structure is thus formed: applying a potential difference between the $i^{th}$ row and the $j^{th}$ column allows the element $M_{ij}$ of the memory to be written to/read from. The term "write" is understood here to mean applying a potential difference that is sufficiently high to significantly modify the resistivity of the element; the term "read" is understood to mean applying a lower potential difference, measuring the value of the current and deducing therefrom the resistance value and therefore the state of the element.

This structure is conventional; the devices of the invention may also be applied to other architectures.

The invention claimed is:

1. A memristive element (M) formed by:
   a first electrode;
   a second electrode; and
   an active region consisting of a thin film of an insertion compound of at least one alkali metal, made of an oxide or chalcogenide of at least one transition metal, exhibiting conductivity that is both electronic and ionic in nature, said active region making direct electrical contact with said first and second electrodes, wherein said first electrode is a surface of a degenerate semiconductor substrate.

2. The memristive element as claimed in claim 1, in which said thin film is deposited on a surface of said first electrode.

3. The memristive element as claimed in claim 1, in which said second electrode is formed by a metallic film deposited on said thin film.

4. The memristive element as claimed in claim 1, in which said thin film has a polycrystalline or amorphous structure.

5. The memristive element as claimed in claim 1, in which said thin film is 10 μm or less in thickness.

6. The memristive element as claimed in claim 1, in which said insertion compound of at least one alkali metal, made of an oxide or chalcogenide of at least one transition metal, has the following formula:

$$A_x(M_1)_v(M_2)_w(M_3)_y(M_4)_z B_\beta$$

where:

A represents one or more alkali metals;

$M_1$ represents at least one metal chosen from Ag and Cu;

$M_2$ represents at least one metal chosen from Mg, Ca, Sr, Ba, Ti, Mn, Fe, Cu and Zn;

$M_3$ represents at least one metal chosen from Al, Ti, V, Cr, Mn, Fe, Co, Ni, Mo and Ta;

$M_4$ represents at least one metal chosen from Ti, V, Mn, Co, Ni, Zr, Sn and Ta;

B represents at least one nonmetal chosen from O, S, Se and Te;

the parameters x, v, w, y, z and β satisfy the following inequalities, x in addition being chosen in the stability field of the compounds:

$0<x\leq 1$ $0 \leq v \leq 1$ $0 \leq w < 1$ $0 \leq y \leq 1$ $0 \leq z < 1$ $1.5 \leq \beta$; and the parameters x, v, w, y, z also satisfy the equality: v+w+y+z=1.

7. The memristive element as claimed in claim 6, in which said insertion compound of at least one alkali metal, made of an oxide or chalcogenide of at least one transition metal, has the following formula:

$$A'_x M_y B_\beta$$

where:

A' represents at least one alkali metal chosen from Li and Na;

M represents at least one metal chosen from Mn, Fe, Co and Ni;

B represents at least one nonmetal chosen from O and S; and the parameters x, y and β satisfy the following inequalities, x in addition being chosen in the stability field of the compounds:

$0 < x \leq 1$ $y=1$ $1.5 \leq \beta$.

8. The memristive element as claimed in claim 6, in which said insertion compound of at least one alkali metal, made of an oxide or chalcogenide of at least one transition metal, is chosen from the following: $Na_xCoO_2$, $Li_xCoO_2$, $Li_xNiO_2$, $Li_xMn_4O_9$, $Li_xTiO_2$, $Li_{4+x}Ti_5O_{12}$, $Li_xV_2O_5$, $Li_xV_6O_{13}$, $Li_xNi_yCo_{(1-y)}O_2$, $Li_xFeO_2$, $Li_xMnO_2$, $Li_xMn_2O_4$, $Li_xMoO_3$ and $Li_xNi_{1/3}Mn_{1/3}Co_{1/3}O_2$, the parameter x being chosen in the stability field of these compounds.

9. The memristive element as claimed in claim 8, in which said insertion compound of at least one alkali metal, made of an oxide or chalcogenide of at least one transition metal, is chosen from $Na_xCoO_2$ and $Li_xCoO_2$.

10. The memristive element as claimed in claim 1, in which said insertion compound of at least one alkali metal, made of an oxide or chalcogenide of at least one transition metal, has a lamellar structure.

11. The memristive element as claimed in claim 1, in which at least one of said first and said second electrodes is made of degenerate silicon.

12. The memristive element as claimed in claim 11, in which one of said first and said second electrodes is made of degenerate silicon, and said insertion compound of at least one alkali metal is $Li_xCoO_2$.

13. The memristive element as claimed in claim 1, in which at least one of said first and said second electrodes is made of a material chosen from aluminum, gallium, indium, antimony, bismuth, cadmium, zinc, tin, and lead.

14. A nonvolatile electronic memory formed from a plurality of memristive elements as claimed in claim 1, arranged in a matrix in rows and columns, all the elements of a given row sharing a common first electrode, and all the elements of a given column sharing a common second electrode.

15. The memristive element as claimed in claim 1, in which said thin film is between 10 nm and 1 μm in thickness.

* * * * *